(12) United States Patent
Lee et al.

(10) Patent No.: US 6,653,698 B2
(45) Date of Patent: Nov. 25, 2003

(54) INTEGRATION OF DUAL WORKFUNCTION METAL GATE CMOS DEVICES

(75) Inventors: Byoung H. Lee, Wappingers Falls, NY (US); Effendi Leobandung, Wappingers Falls, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/034,009

(22) Filed: Dec. 20, 2001

(65) Prior Publication Data

US 2003/0119292 A1 Jun. 26, 2003

(51) Int. Cl.$^7$ ............................................. H01L 29/76
(52) U.S. Cl. ..................................................... 257/407
(58) Field of Search ................................ 257/407, 388, 257/392, 204

(56) References Cited

U.S. PATENT DOCUMENTS

| | | | |
|---|---|---|---|
| 5,447,874 A | 9/1995 | Grivna et al. | 437/40 |
| 6,033,963 A | 3/2000 | Huang et al. | 438/303 |
| 6,057,555 A | 5/2000 | Reedy et al. | 257/9 |
| 6,066,533 A | 5/2000 | Yu | 438/275 |
| 6,140,688 A * | 10/2000 | Gardner et al. | 257/412 |
| 6,166,417 A * | 12/2000 | Bai et al. | 257/407 |
| 6,187,657 B1 | 2/2001 | Xiang et al. | 438/596 |
| 6,291,282 B1 | 9/2001 | Wilk et al. | 438/203 |
| 6,518,154 B1 * | 2/2003 | Buynoski et al. | 438/585 |

FOREIGN PATENT DOCUMENTS

GB  2347789 A  9/2000

OTHER PUBLICATIONS

B. Maiti and P. J. Tobin, "Metal gates for advanced CMOS technology", Proceedings of the SPIE—The International Society for Optical Engineering Conference, Sep. 1999, vol. 3881, pp. 46–57.

P. Fryer and L. Krusin–Elbaum, "Method for Producing MOS Devices with Particular Thresholds within a Range by Providing Mixed Metal Gate Electrodes", Technical Disclosure Bulletin (TDB), Aug. 1988, pp. 46–47.

D. A. Buchanan, D. Neumayer, and P.R. Varekamp, "CMOS Metal High K Gate Device and Method", IBM Docket FIS9–1999–0250US1, Ser. No. 09/592,031, Filed Jun. 12, 2000.

W. Long and K. K. Chin, Dual material gate field effect transistor (DMGFET), IEEE IEDM Technical Digest, 1977, pp. 549–552.

X. Zhou and W. Long, "A novel hetero–material Gate (HMG) MOSFET for Deep–submicron ULSI Technology", IEEE Transactions on Electtron Devices, vol. 45, #12, 1998.

\* cited by examiner

Primary Examiner—David Nelms
Assistant Examiner—Quoc Hoang
(74) Attorney, Agent, or Firm—Joseph P. Abate

(57) ABSTRACT

A dual work function CMOS metal gate device provides a composite metal gate electrode structure. The composite metal gate structure includes a bulk metal and a thin metal layer having an appropriate work function for the transistor type and desired threshold voltage, $V_T$. Both N-channel and P-channel transistors are formed to have distinct threshold voltages by incorporating the metal material having the appropriate work function for the desired $V_T$ into the composite metal gate electrode. The two different electrodes of the N-channel and P-channel transistors are electrically connected by means of the bulk metal.

9 Claims, 5 Drawing Sheets

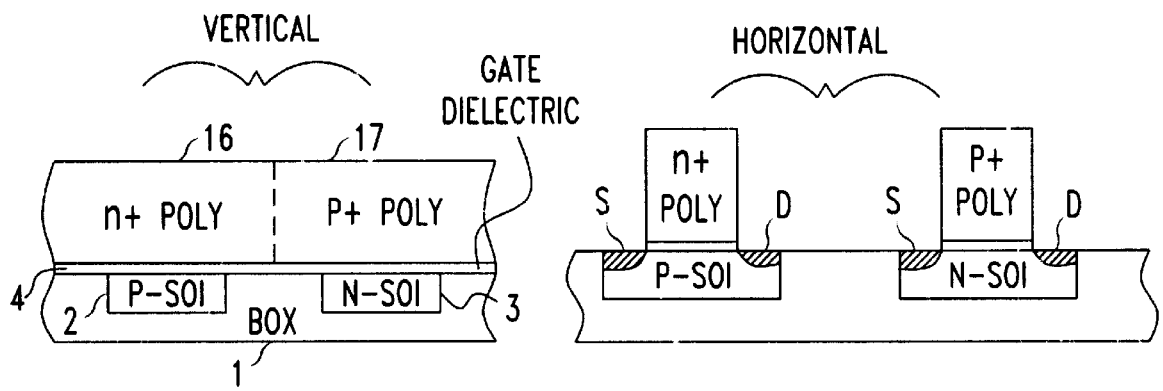
FIG. 2A
FIG. 2B
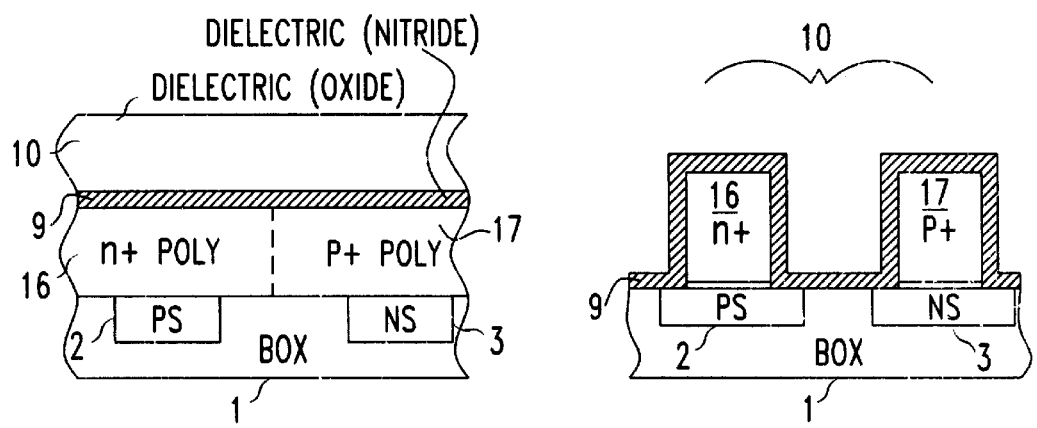
FIG. 3A
FIG. 3B
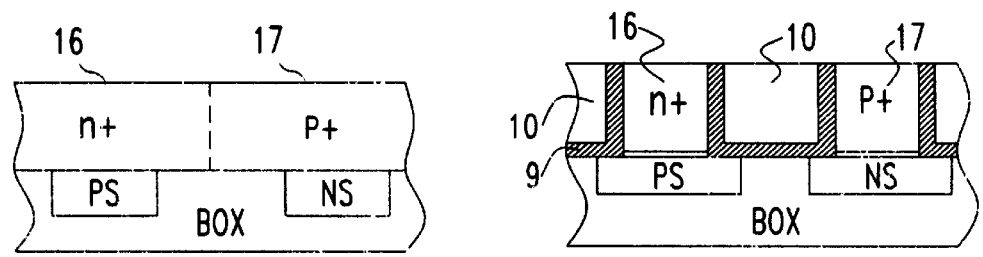
FIG. 4A
FIG. 4B

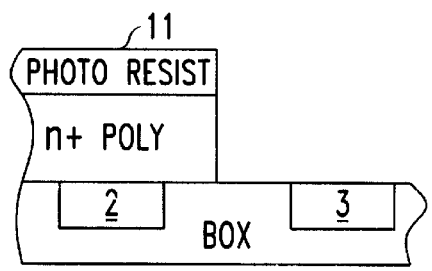
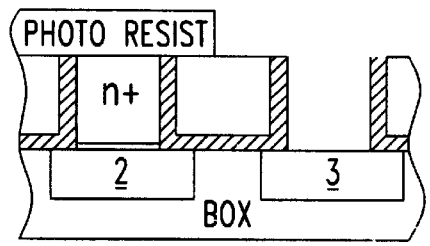
FIG. 5A  
FIG. 5B
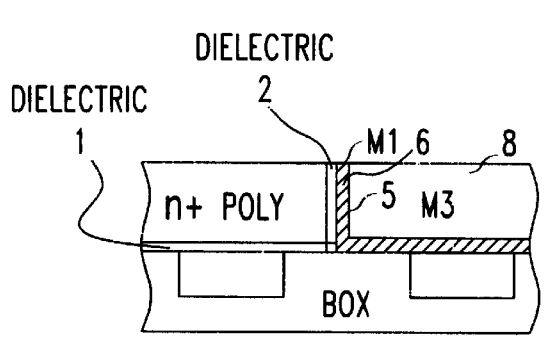
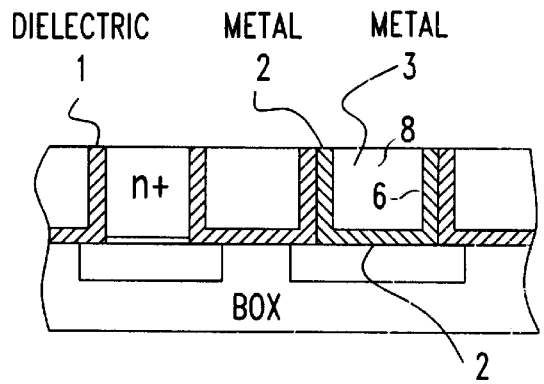
FIG. 6A  
FIG. 6B
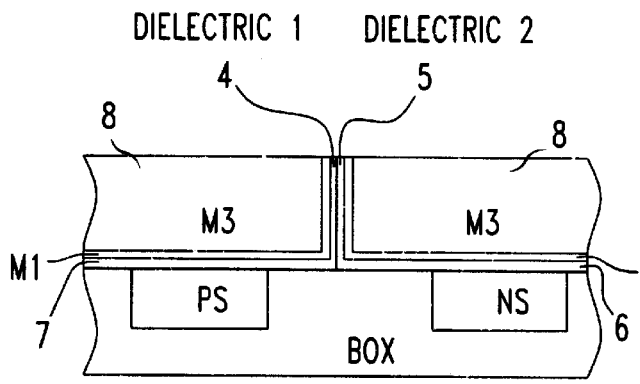
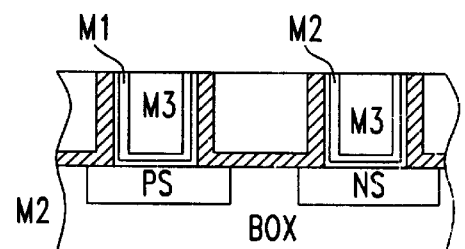
FIG. 7A  
FIG. 7B

INTEGRATION OF DUAL WORKFUNCTION METAL GATE CMOS DEVICES

TECHNICAL FIELD

The present invention relates generally to semiconductor devices and methods for forming the such devices. More particularly, the present invention is directed to metal gate structures that provide a practical way of device integration.

BACKGROUND OF THE INVENTION

Complementary metal-oxide-semiconductor (CMOS) circuits are becoming more highly integrated and the individual devices which combine to form a CMOS circuit are becoming increasingly smaller. With the continued scaling of CMOS devices down to sub 100 nm gate lengths and beyond, the silicon dioxide ($SiO_2$) or "oxide" conventionally used as a gate dielectric has been correspondingly reduced to thicknesses of less than 20 angstroms (Å).

However, device scaling based on polysilicon gate scaling and gate oxide thickness reduction is seriously challenged as the thickness of the gate oxide is scaled below 20 Å. The gate leakage currents, determined by quantum-mechanical direct tunneling through these thin oxides, reach intolerably high limits for these ultra-thin gate dielectrics. For example, current densities greater than 1 $amp/cm^2$ are typical for gate oxides having thicknesses in the 15–17 Å range. Also, dopant diffusion from the polysilicon gate seriously limits further scaling of $SiO_2$ based gate dielectrics because the thinner gate oxide is more vulnerable to dopant penetration.

A metal gate can eliminate the dopant penetration problem. With the metal gate, the poly depletion effect can be eliminated and the same electrical performance can be obtained even with a thicker gate oxide. Typical poly depletion increases electrical thickness of the gate oxide by 4–6 Å. Thus, leakage current can be reduced by one to two orders of magnitude compared to a polysilicon gate at the same electrical thickness.

Leakage current can be further reduced by using alternative gate dielectrics. These alternative gate dielectrics are chosen to have higher permittivity values than silicon dioxide. Dielectric films having permittivities, or dielectric constants (K), higher than silicon dioxide are referred to as high-K dielectric films. When these high-K dielectric films are used as gate dielectric films, the physical thickness of the gate dielectric can be large while the electrical equivalent thickness relative to $SiO_2$ can be scaled for compatibility with the other reduced feature sizes. The thickness ($t_{eq}$) of a high-dielectric constant film, for example, may be calculated by the formula:

$$t_{eq} = t_{phy}(\epsilon SiO_2/\epsilon high\text{-}K)$$

where $t_{phy}$ is the actual thickness of the substitute film and $\epsilon SiO_2$ and $\epsilon high\text{-}K$ are the dielectric constants of $SiO_2$ and the high-K dielectric film, respectively.

However, recent research has shown that these high-k dielectrics like $ZrO_2$ and $Al_2O_3$ have poor compatibility with a polysilicon gate, while some metal electrodes have shown very good compatibility with high-K dielectrics. The high-K dielectric gate materials, which are becoming favored as gate dimensions shrink, generally cannot withstand high-temperature (>600° C.) processing after they are deposited onto a silicon substrate. Therefore, the use of polysilicon, which must be formed and doped using high-temperature processing, is restricted or precluded when a high-K dielectric gate material is used.

Lower leakage current, and freedom from dopant penetration and poly depletion effect can be significant advantages for pursuing a metal electrode. The predominant gate material for CMOS devices seems to have been doped polysilicon which enables the formation of dual work function devices needed for CMOS. Dual work function devices are produced by doping the polysilicon gates differently depending on the specific device. A dual work function is required because CMOS devices include both N-channel transistors, also known as NFET (N-channel Field Effect Transistors), and P-channel transistors, also known as PFET (P-channel Field Effect Transistors). N-channel and P-channel transistors formed within the same device operate at different threshold voltages. The threshold voltage of a transistor is directly related to the work function of the gate material.

For a seamless transition from use of a polysilicon gate to a metal gate, two different metal electrodes with workfunctions similar to n+poly and p+poly are desired. See, for example, "Metal Gates for Advanced CMOS Technology," by Maiti et al., SPIE Conference on Microelectronic Device Technology III, Santa Clara, Calif. (SPIE Vol. 3881, September 1999, pgs. 46–57), U.S. Pat. No. 6,291,282, METHOD OF FORMING DUAL METAL GATE STRUCTURES OR CMOS DEVICES, Wilk, et al., Sep. 18, 2001, and FIS9-1999-0250US1, D. A. Buchanan, D. Neumayer, and P. R. Varekamp, "CMOS Metal High K Gate Device and Method", Ser. No. 09/592,031, Filed Jun. 12, 2000, which are all incorporated herein by reference. However, the present inventors believe that conventional CMOS technology is not readily compatible with gate electrodes formed of two different materials (e.g., metals), because two different metal gate electrodes cannot be readily connected electrically if a conventional CMOS process is used.

The present invention provides an integration method to build a dual workfunction CMOS device with metal gate electrodes.

SUMMARY OF THE INVENTION

The present invention provides a structure and method for providing metal gate electrodes which are compatible with CMOS transistors. The metal gate electrode is a composite structure which includes a bulk metal film and a thin metal layer or metal alloy layer. The layer includes/exhibits a particular work function chosen in conjunction with the desired $V_T$ of the transistor being formed. With respect to CMOS devices having both P-channel and N-channel transistors, the present invention provides a semiconductor device including a P-channel transistor having a first metal gate formed of a first composite film including a bulk metal film formed over a first metal layer having a first work function, and an N-channel transistor having a second metal gate formed of a second composite film including the bulk metal film formed over a second metal layer having a second work function which is different from the first work function. Each of the first metal layer and second metal layer is chosen to produce a desired threshold voltage, $V_T$, for the respective transistor. According to an essential aspect of the present invention, the bulk metal film suitably electrically connects the first metal layer to the second metal layer.

The present invention also includes a method to connect the two different metals. In this method, two metal gates are formed locally in trench-shaped gates which are recessed using a wet etch or a reactive ion etch. A bulk metal electrode is filled into the recessed trench region. In this method, the bulk metal electrode (e.g., film) is not necessarily the same composition as the two initial metal electrodes.

It is to be understood that the foregoing brief description and the following detailed description are intended to be exemplary, not restrictive, of the present invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures, each of which shows a cross-sectional view:

FIGS. 2A–9B show cross-sectional schematic views of minor (A) and major (B) sides of structures in a process sequence used to form an exemplary embodiment of the present invention;

FIG. 2 shows a process step for a CMOS device having N and P channel transistors each with a source-drain and a gate;

FIG. 3 shows a molding film wrapping the polysilicon gates shown in FIG. 2;

FIG. 4 shows a planarized structure exposing the tops of the polysilicon gates;

FIG. 5 shows the structure after removal of one type of polysilicon gate (e.g., p+poly)

FIG. 6 shows the structure in FIG. 5 filled with a new dielectric and a metal gate after metal planarization;

FIG. 7 shows the structure where n+poly silicon is replaced with another kind of dielectric and a metal gate;

FIG. 8 shows the structure after portions of metal layers shown in FIG. 7 are removed;

FIG. 9 shows the structure shown in FIG. 8 after another metal has been filled.

DETAILED DESCRIPTION OF THE INVENTION

The present invention will be described with reference to FIGS. 1–10. The steps shown in FIGS. 2A through 7B are well known to those skilled in the art, and therefore need not be described in detail.

The present invention provides a dual work function metal gate CMOS device and a method for forming the device. The present invention enhances the versatility of metal gate structures by providing dual metal gate structures within a semiconductor device, in which each gate structure is formed of a composite metal structure including a thin metal layer chosen to have a work function compatible with the transistor type and the threshold voltage, $V_T$, of the transistor device being formed, and each composite gate structure includes a bulk metal film which electrically connects one gate structure to the other gate structure. In a CMOS device having both N-channel and P-channel transistors, an aspect of the present invention provides for setting the threshold voltages of each of the N-channel and P-channel transistors by forming a first composite metal gate structure having a first work function being compatible with the prescribed threshold voltage of the N-channel transistor, and a second composite metal gate structure having a second work function being compatible with a prescribed threshold voltage of the P-channel transistor. By choosing the materials used to form the composite metal gate structures based on the work functions of the materials chosen, the present invention can influence or set the operating threshold voltages of various P-channel and N-channel transistors. In this manner, a prescribed threshold voltage may be produced.

The threshold voltage of a transistor is related to the work function of the gate material according to the following equation:

$$V_{T0} = \phi_{ms} - 2\phi_f - Q_{tot}/C_{diel} - Q_{BO}/C_{diel} \qquad (I.)$$

where $\phi_{ms}$ is the work function difference (in V) between the gate material and the bulk silicon in the channel, $\phi_f$ is the equilibrium electrostatic potential in a semiconductor (in V), $Q_{BO}$ is the charge stored per unit area (C/cm$^2$) in the depletion region (when the voltage between source and body is zero), $C_{diel}$ is the gate dielectric capacitance per unit area (F/cm$^2$), and $Q_{tot}$ is the total positive dielectric charge per unit area present at the interface between the gate dielectric and the bulk silicon.

The above-identified device parameters are determined by the bulk semiconductor materials used; the doping level and structure of the semiconductor materials; and the nature, thickness, and structure of the gate dielectric materials used. These device variables are determined, in turn, by the various processing parameters used to form the materials. For a given set of processing parameters and device parameters, then, it can be seen that a desired threshold voltage can be produced by appropriately choosing the work function of the gate material.

Figure 1:
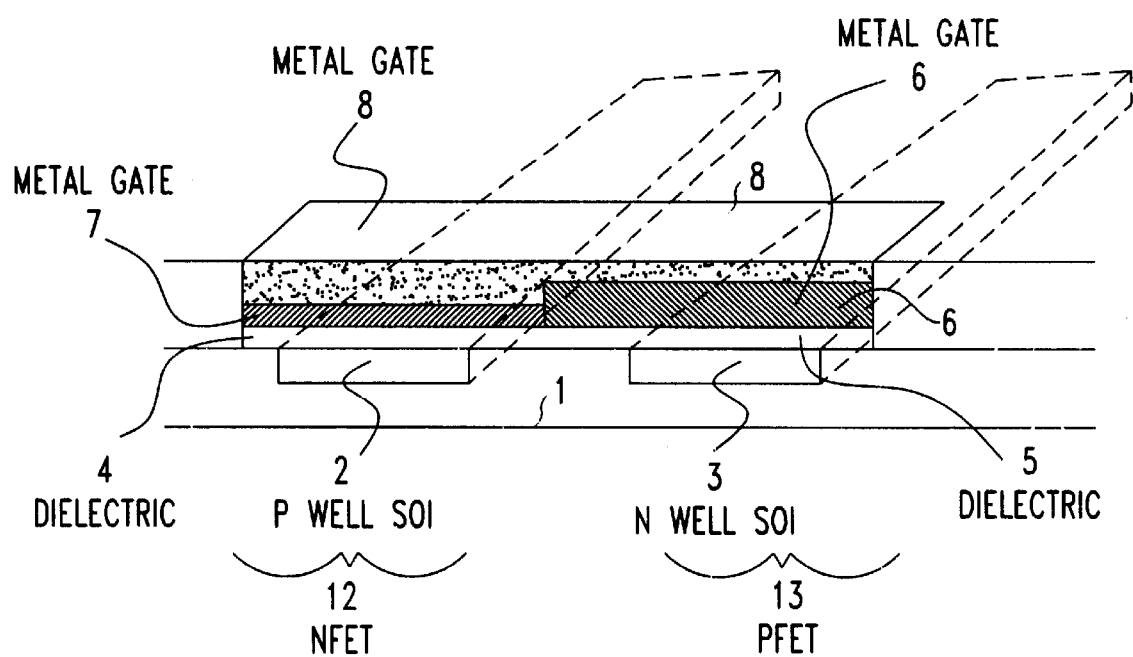
FIG. 1 shows an exemplary embodiment of a pair of transistors having metal gate structures formed of materials having different work functions, and electrically connected according to the present invention.

FIG. 1 shows an exemplary embodiment of a dual metal gate structure according to the present invention, having a metal film 8 electrically connecting two metal layers 6,7. FIG. 1 shows an NFET 12 (N-channel Field Effect Transistor) and a PFET 13 (P-channel Field Effect Transistor) formed over a substrate 1. The substrate is formed of a semiconductor material such as silicon, commonly used as a substrate in the semiconductor manufacturing industry. In the preferred embodiment, the substrate may be a silicon-on-insulator(SOI) wafer, but the substrate 1 alternatively could be a bulk wafer. NFET 12 and PFET 13 are separated by a known shallow trench isolation (STI) device (not shown) formed on a buried oxide (not shown).

NFET 12 includes source-drain regions and a channel region. Channel region is, in the example illustrated, an N-type channel region 2 formed within P-type SOI layer. Channel region may be defined and source-drain regions may be formed using conventional methods and materials, which need not be further discussed. NFET 12 also includes a gate dielectric film 4 formed over the surface of substrate 1. Gate dielectric film 4 may have a thickness ranging from 10 to 50 Å according to various exemplary embodiments. For highly integrated devices including structures of reduced feature size, the thickness of the dielectric film 4 may be in the 5–40 Å range. The channel region and gate dielectric film may be referred to as a transistor substructure.

Gate dielectric film 4 may be a conventional gate dielectric material such as silicon dioxide or silicon dioxide in conjunction with silicon nitride. In an exemplary embodiment, gate dielectric film 4 may be a composite film of silicon dioxide and silicon nitride. Gate dielectric film may alternatively be formed of a dielectric material having a high dielectric constant, referred to as a high-K dielectric material. NFET 12 and PFET 13 may have different dielectric materials. The high-K dielectric material may have a dielectric constant, K, of greater than 4.0 according to exemplary embodiments. Conventionally used silicon dioxide films typically have a dielectric constant, K, ranging from 3.9 to 4.0.

The high-K dielectric material may be a metal oxide such as $Al_2O_3$, $Ta_2O_5$, $ZrO_2$, and $HfO_2$, pervoskite type oxides, aluminates, niobate or tantalate system materials, bi-layered pervoskite system materials, and high epsilon silicates including $ZrSiO_4$, $AlSiO$, $BaSiO_4$, and $PbSiO_4$. In an exemplary embodiment, the high-K gate dielectric material may be $HfO_2$ formed to have a thickness of 30 Å. These high-K dielectric materials are intended to be exemplary only, and various other high-K dielectric materials may be used in alternative embodiments. Also, various kinds of treatment on high-K dielectrics can be used such as $NH_3$ anneal, O+ anneal, NO anneal, and $N_2O$ anneal, all well known. As discussed above, in the exemplary embodiments for which gate dielectric film 4 is a high-K dielectric material, its thickness will generally be greater than the thickness of a silicon dioxide material having similar dielectric properties. When a high-K dielectric material is used, thickness may be greater than 20 Å. As such, the formation of an ultra-thin gate film, which may not always be reliably formed, is avoided. Gate dielectric film 4 may be formed using conventional methods.

NFET 12 includes a first composite metal gate formed of a first bulk metal film 8 over a first metal layer 7. In the preferred embodiment, bulk metal film 8 may be W or Mo because of their high melting points, but other materials such as Al, Ti, Cr, and Cu may be used in alternative embodiments. According to the various exemplary embodiments, the work function of bulk metal film 8 may range from 3.5 to 5.5 electron-volts. The film 8 may have a thickness (e.g., vertical direction in FIG. 1) in a range of 200–1500 Å.

NFET 12 includes a first metal layer 7 having a work function of about (±10%) 4.1 electron-volts. Suitable metals which may be used for first metal layer 7 in NFET 12 may include, but are not limited to, Al, Ag, Bi, Cd, Fe, Ga, Hf, In, Mn, Nb, Y, Zr, TaN, TaSiN, and alloys of elemental metals such as RuTa, TiNi. According to various exemplary embodiments, first metal layer 7 may include a work function within the range of 3.8 to 4.4 electron-volts, and in a preferred embodiment will have a work function of about 4.1 electron-volts. Alternatively, first metal layer 7 may include an alloy mixture of two or more metals which combine to produce a work function of about 4.1 electron-volts. According to another exemplary embodiment, an electrically conductive metal oxide or nitride which has a suitable work function may be used to form first metal layer 7. Examples of such metal nitrides include, but are not limited to, TaN, TiN, TaSiN, and TiSiN.

The work function of the first composite metal gate 7,8 which includes the first bulk metal film 8 formed over the first metal layer 7, is determined largely by the work function of the first metal layer 7 which is formed directly on the gate dielectric film 4. The threshold voltage, $V_T$, of a typical CMOS transistor may generally range from about 0.2 to about 0.3 volts, but other threshold voltages may be used. As discussed above, the threshold voltage of NFET 12 will be determined by the work function of first composite metal gate 7,8, in conjunction with the other device parameters discussed previously.

PFET 13 is formed over N-well region 3 which is formed within P-type SOI layer. PFET 13 includes a channel region and an opposed pair of source-drain regions which bound the channel region. PFET 13 may include the same gate dielectric film 4, or other type of dielectric film 5 such as high-K dielectric film.

PFET 13 includes a second composite metal gate 6,8 formed of a bulk metal film 8 over a second metal layer 6. Second bulk metal film is as described in conjunction with first bulk metal film 8 of NFET 12. Alternatively, first bulk metal film 8 and second bulk metal film 8 may be the same material. According to an alternative embodiment, first bulk metal film 8 and second bulk metal film may be different materials such as combination of W and WN, W and Mo, W and Cu or W/WN/Cu.

Second metal layer 6 used for PFET 13 has a work function within the range of 4.6 to 5.5 electron-volts, and in the preferred embodiment may include a work function of about 5.0 electron-volts. Similarly to NFET 12, the metal layer 6 (second metal layer 6 for PFET 13) is formed directly on gate dielectric film 5, and largely determines the overall work function of second composite metal gate 6 which includes bulk metal film 8 formed over second metal layer 6. Second metal layer 6 may be formed of metals such as Ni, Pd, Pt, Be, Ir, Te, Re, Ru and Rh, but alternatively other suitable metals may be used. According to one embodiment, second metal layer 6 may include an alloy mixture of two or more metals which combine to produce a work function of about 5.0 electron-volts. In yet another embodiment, an electrically conductive metal oxide or metal nitride, which has a suitable work function, may be used to form second metal layer 6. An example of such a metal oxide is $RuO_2$. As described in conjunction with NFET 12, the threshold voltage of PFET 13 is determined by the work function of second metal layer 6 in conjunction with the various other device parameters associated with PFET 13.

The dimensions (including thicknesses) of the various device features described above may be the dimensions associated with state-of-the-art semiconductor transistor devices which are capable of being produced by presently available processing equipment. Both NFET 12 and PFET 13 are highly integrated devices scaled downed to minimal dimensions. These devices include, for example, gate lengths of less than 0.2 microns. It is an aspect of the present invention, however, that, for the exemplary embodiments in which gate dielectric film 6 comprises a high-K dielectric material, the thickness of the highly integrated transistors need not be less than 20 Å.

FIG. 1 shows a pair of transistors, PFET 13 and NFET 12, formed in close proximity to one another, and electrically connected by means of film 8 according to the present invention. The two different transistors have different threshold voltages ($V_T$'S) and correspondingly have different metal gate work functions and, as shown in the following figures, may be spaced apart at various locations within the semiconductor device. In addition, the transistors and corresponding gate structures are not intended to be limited to the exemplary transistors and gate structures shown. As an example, these device can be formed on a bulk substrate. As another example, one side of an electrode can be formed with a single material instead of stacked materials.

In FIG. 2(A, B), the first step of a process sequence used to form the exemplary embodiment of the present invention is shown. FIGS. 2A–9B show the process steps. FIG. 2 is a cross-sectional view showing a conventional CMOS structure in a direction of gate (FIG. 2A) and across the gate (FIG. 2B). NFET 12 is formed on p-type doped SOI layer and PFET 13 is formed on n-type doped SOI layer. Alternatively, substrate 1 may be a bulk silicon wafer commonly used in the semiconductor processing industry.

In FIG. 3(A, B), a thick nitride layer 9 and an oxide layer 10 are deposited on the gate structure shown in FIG. 2.

Typical nitride thickness ranges from 100–400 Å and oxide thickness can be in a range of 500–3000 Å, depending on the planarization process. In this particular embodiment, 300 Å of nitride and 1300 Å of oxide can be used, but other thicknesses alternatively may be used. Known deposition techniques are employed.

In FIG. 4(A, B), oxide and nitride layers are planarized down to the polysilicon gate surface 16,17. As an example, chemical mechanical polishing (CMP) process may be used for the planarization step.

FIG. 5(A, B) shows the structure depicted in FIG. 4 after one type of poly (p+) is removed. The polysilicon gate can be removed with a wet etching and/or reactive ion etching selective to oxide and nitride. The gate dielectric 4 is also removed to grow or to deposit another dielectric. Gate oxide removal can be also done with a wet etch or a gentle reactive ion etching that does not attack the silicon surface. In this example, p-type polysilicon is removed first, but n-type polysilicon alternatively can be removed first.

FIG. 6(A, B) shows the structure where the p type of polysilicon is replaced with a metal electrode by repeating the processes shown and described in connection with FIG. 5. After removing one kind of polysilicon, then a gate dielectric, a thin metal layer, and a bulk metal layer are filled into the trench and planarized. Gate dielectric 5 can be either the same or different for NFET 12 and PFET 13, respectively. Oxidation, chemical vapor deposition and atomic layer deposition and molecular beam epitaxy are the processes that can be used to form gate dielectric. The metal layers are formed using conventional techniques.

Thin metal layer 6 is chosen in conjunction with the other device parameters according to the relationship (I.) discussed above. According to the preferred embodiment, Re and Pt may be used as the preferred material of choice for thin metal layer for PFET 13. According to other exemplary embodiments, a metal such as Ni, Pd, Pt, Be, Au, Ir, Ru, and Rh may be used. The metals chosen to be used as thin metal layer 6, to form part of the metal gate structure for the PFET 13 transistor being formed, will have a work function in the range of 4.6 to 5.5 electron-volts, and in the preferred embodiment will have a work function of about 5.0 electron-volts. The specific work function will depend upon the desired threshold voltage and the other known device parameters. Alternatively, second metal layer 6 may be a composite alloy of a number of metal materials, chosen and combined to produce a work function of about 5.0 electron-volts. The composite alloy is, for example, $Ru_xTa_y$ and TiAlN.

In an exemplary embodiment, thin metal layer 6 may have a thickness of about 20–300 Å, but other thicknesses may be used. Thin metal layer 6 may be formed using known sputtering, evaporation, CVD, or PECVD methods. For the embodiment in which second metal layer 6 is a composite alloy, techniques such as co-evaporation and co-sputtering from either single or double sources may be used to produce second metal layer 6. Alternatively, the thin metal layer 6 may be an electrically conductive metal nitride or metal oxide such as $RuO_2$, having a work function within the range of 4.6 to 5.5 electron-volts.

Over thin metal layer 6, and filling the first opening, the first bulk metal film 8 is formed. First bulk metal film 8 may be W or Mo according to the preferred embodiment, and materials such Ti, Cr, and Cu may also be used according to other exemplary embodiments. Metal such as W and Mo are preferred for use as bulk metal films such as first bulk metal film 8 because of their high melting points. Preferred PFET 13 liner metals (first metal layer 6) are Fe, Mn, and Nb because of their ability to form alloys with the preferred materials used to form first bulk metal film 8. First bulk metal film 8 may be formed according to conventional methods such as sputter deposition, evaporation, CVD, and PECVD, and will be formed to a thickness sufficient to fill the first opening.

The bulk metal layer 8 is planarized using chemical mechanical polishing (CMP). According to other exemplary embodiments, other known polishing techniques may be used. Portions of first metal layer 6 and first bulk metal film 8 is removed to expose polysilicon gate(n+) for next gate removal step.

FIG. 7 (A, B) shows the structure wherein both types of polysilicon are replaced with metal electrodes by repeating the processes shown and described in connection with FIG. 4 and FIG. 5. With a same sequence, the other kind of polysilicon can be replaced with other kinds of gate dielectric, thin metal, and bulk metal.

Thin metal layers 6,7 should have different workfunctions to adjust the threshold voltage of NFET 12 and PFET 13 appropriately. The N-channel transistor may be formed to include an operating threshold voltage, $V_T$, within the range of 0.2 to 0.3 volts. Second metal layer 7 has a work function chosen in conjunction with other device parameters, which will produce the desired threshold voltage. Second metal layer 7 may be chosen to have a work function of about 4.1 electron-volts. Materials having work functions ranging from 3.6 to 4.5 electron-volts may be used alternatively, depending on the other known device parameters of the transistor being fabricated. In the preferred embodiment, metal layer 7 may be TaN, TaSiN but other suitable metals such as Al, Ag, Bi, Cd, Ga, Hf, In, Y, Zr, Fe, Mn, or Nb, and alloys of elemental metals such as TiNi may be used alternatively. The material will be chosen to include a work function compatible with the prescribed threshold voltage at which the device will operate. In an alternative embodiment, an alloy of combined metal materials may be used to form metal layer 7, with the combination of metal materials chosen to produce a desired work function in the range of 3.6 to 4.5 electron-volts. Second metal layer 7 may be formed by evaporation or sputtering for pure metals, or co-evaporation or co-sputtering from either single or double sources, for alloys of combined metals. Alternatively, CVD, plasma-enhanced chemical vapor deposition (PECVD), or other physical vapor deposition (PVD) methods may be used to form first metal layer 7. In an exemplary embodiment, second metal layer 7 may have a thickness of about 20–300 Å, but other thicknesses may be used alternatively.

Figure 8A:
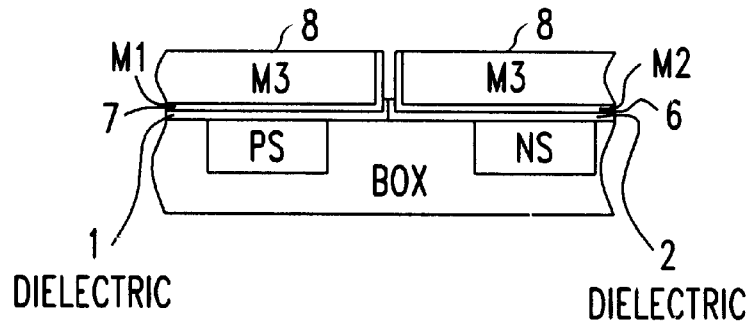
Figure 8B:
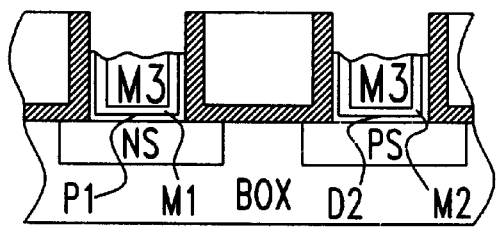

FIG. 8 (A, B) shows the structure shown in FIG. 7 after an etchback of the bulk metal layer 8. Bulk metal, thin metal at the side wall of trench, and gate dielectrics are etched together using wet etch or reactive ion etching down to the middle of the gate (FIG. 8B).

Figure 9A:
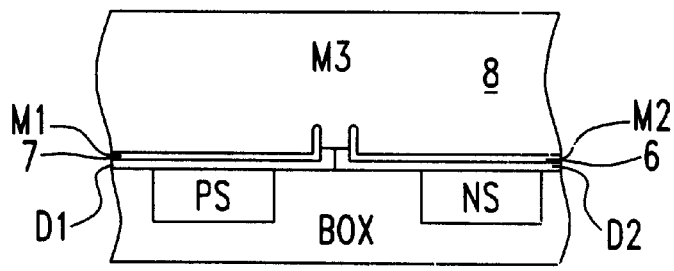
Figure 9B:
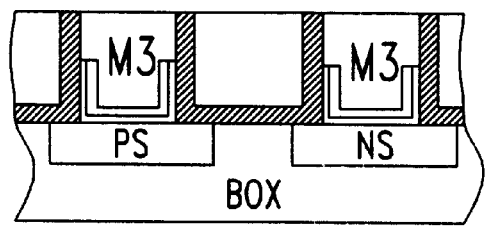
Figure 10:
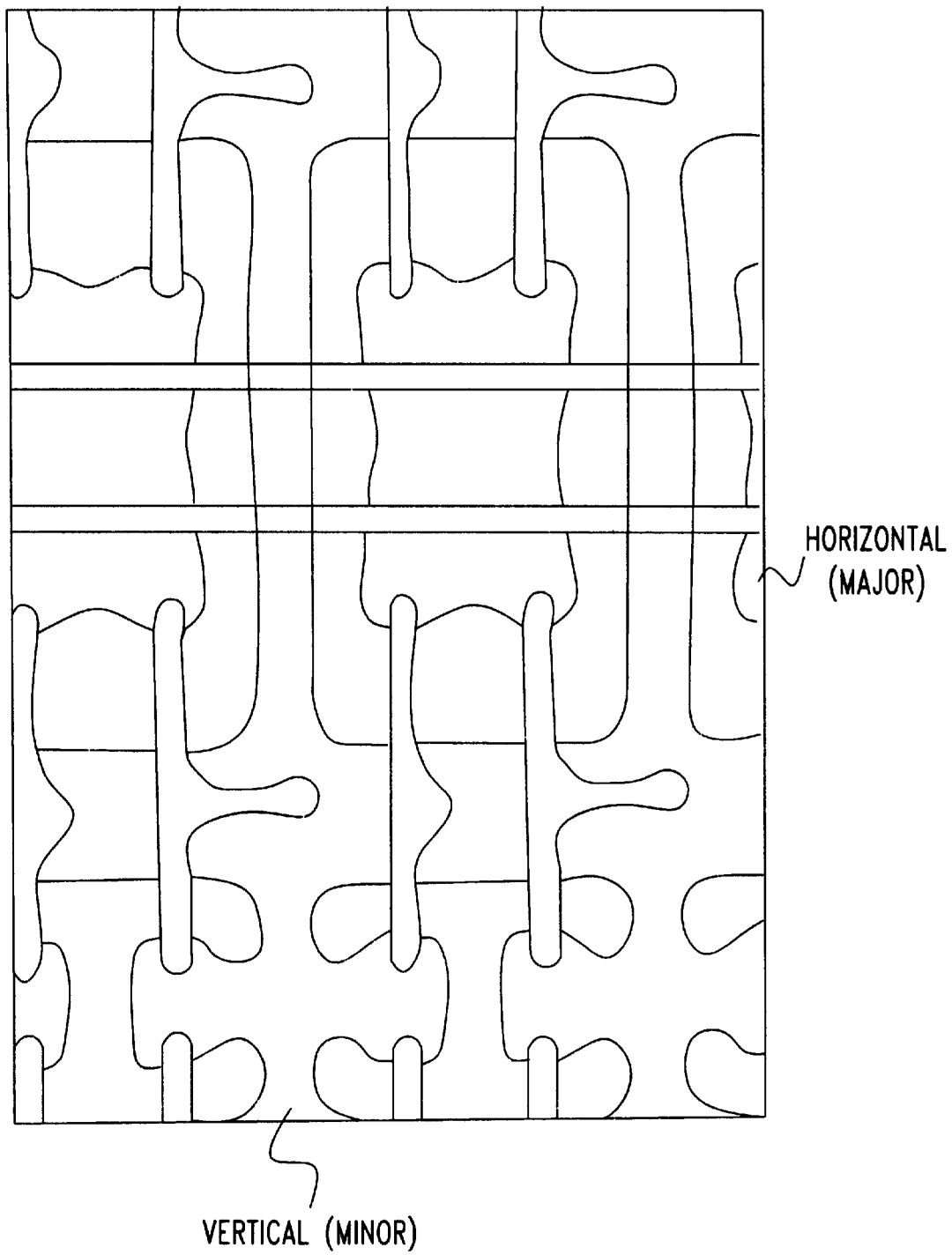
FIG. 10 is a top plan view of a dual work function metal gate CMOS device according to the present invention, showing minor and major sides.

FIG. 9 (A, B) shows the structure shown in FIG. 8 filled with the bulk metal layer 8 and planarized down to the dielectric surface 9. In this embodiment, bulk metal used to form the stack gate and bulk metal used to form the strap layer (connecting layer) are same, but different kinds of material can be used, for example, W/Mo stack can be used. FIG. 8 and FIG. 9 shows key process steps to form electrically connected metal electrode that, it is believed, can not be achieved with conventional processes proposing the use of metal gates.

It should be understood that the foregoing description of exemplary embodiments has been presented for the purpose of illustrating and describing the main points and concepts of the present invention. The present invention is not limited, however, to these embodiments. For example, multiple transistors, either NFET 12's or PFET 13's, may be included within a semiconductor device according to the present invention. Each NFET 12 or PFET 13 will include a metal liner which has a work function chosen to produce a prescribed operating threshold voltage for the particular device. In addition, variations of the process sequence detailed may be used to form the various exemplary embodiments.

Although several particular exemplary embodiments of the plurality of composite metal gate structures have been described to illustrate the present invention, the present invention includes all modifications and equivalents of the disclosed embodiments falling within the scope of the appended claims.

What is claimed:

1. In a semiconductor device which includes a P-channel transistor having a first metal gate formed of a first composite film including a bulk metal film formed over a first conductive film have a first work function, and an N-channel transistor having a second metal gate formed of a second composite film including said bulk metal film formed over a second conductive film having a second work function being different from said first work function, the improvement comprising said bulk metal film electrically connecting said first conductive film to said second conductive film, and said bulk metal film having a work function within a range of 4.0 to 5.2 electron-volts.

2. The semiconductor device as in claim 1, wherein said bulk metal film is a metal selected from the group consisting of W, Mo, Ti, Cr and Cu.

3. The semiconductor device as in claim 1, wherein said first conductive film of said first metal gate is a composite alloy.

4. The semiconductor device as in claim 3, wherein said metal film has a thickness in a range of 200 Å to 1500 Å.

5. The semiconductor device as in claim 1, wherein said first work function has a value within the range of 4.6 to 5.5 electron-volts.

6. The semiconductor device as in claim 1, wherein said second work function has a value within the range of 3.6 to 4.5 electron-volts.

7. The semiconductor device as in claim 1, wherein said first conductive film is formed of at least one metal selected from the group consisting of Ni, Pd, Pt, Be, Ir, Te, Re, Ru, and Rh.

8. The semiconductor device as in claim 1, wherein said second conductive film is formed of at least one metal selected from the group consisting of Al, Ag, Bi, Cd, Fe, Ta, Ga, Hf, In, Mn, Nb, Y, and Zr.

9. The semiconductor device as in claim 1, wherein at least one of said first conductive film and said second conductive film comprises one of a metal nitride and a metal oxide.

* * * * *